United States Patent [19]

Litteral

[11] Patent Number: 5,368,899
[45] Date of Patent: Nov. 29, 1994

[54] AUTOMATIC VERTICAL DIP COATER WITH SIMULTANEOUS ULTRAVIOLET CURE

[75] Inventor: Mary O'Connell Litteral, Kokomo, Ind.

[73] Assignee: Delco Electronics Corp.

[21] Appl. No.: 926,114

[22] Filed: Aug. 7, 1992

Related U.S. Application Data

[63] Continuation-in-part of Ser. No. 843,385, Feb. 28, 1992, abandoned.

[51] Int. Cl.$^5$ .................... B05D 1/18; B05D 3/06
[52] U.S. Cl. .................... 427/512; 427/515; 427/558; 427/96
[58] Field of Search .............. 427/512, 515, 558, 96; 118/423; 198/470.1, 678.1

[56] References Cited

U.S. PATENT DOCUMENTS

| | | | |
|---|---|---|---|
| 2,728,686 | 12/1955 | Borushko | 118/423 |
| 2,750,923 | 6/1956 | Daniel | 118/423 |
| 2,874,522 | 2/1959 | McCabe | 29/430 |
| 2,919,705 | 1/1960 | Vitense | 134/122 |
| 3,049,768 | 8/1962 | Powell | 22/93 |
| 3,391,474 | 7/1968 | Hays, Jr. | |
| 3,745,307 | 7/1973 | Peek, Jr. et al. | 432/31 |
| 3,795,047 | 3/1974 | Abolafia et al. | |
| 3,836,388 | 9/1974 | Fowler | 117/120 |
| 3,916,513 | 11/1975 | Ballard | |
| 4,025,795 | 5/1977 | Lackore et al. | 250/504 |
| 4,059,708 | 11/1977 | Heiss, Jr. et al. | 427/96 |
| 4,086,696 | 5/1978 | Ikuta | 29/627 |
| 4,254,163 | 3/1981 | Piazza | 427/96 |
| 4,287,226 | 9/1981 | Pirvics et al. | 427/54.1 |
| 4,373,129 | 2/1983 | Sugalski et al. | |
| 4,424,252 | 1/1984 | Nativi | 428/209 |
| 4,508,758 | 4/1985 | Wong | 427/96 |
| 4,560,584 | 12/1985 | Henninger | 427/96 |
| 4,602,417 | 7/1986 | Mesch et al. | |
| 4,623,559 | 11/1986 | Hudock | 427/54.1 |
| 4,661,368 | 4/1987 | Rohde et al. | 427/8 |
| 4,674,181 | 6/1987 | Hamada et al. | 29/430 |
| 4,695,482 | 9/1987 | Weiswurm | 427/96 |
| 4,753,819 | 6/1988 | Shimeda | 427/96 |
| 4,775,046 | 10/1988 | Gramavossa et al. | 118/423 |
| 4,784,872 | 11/1988 | Moeller et al. | 427/96 |
| 4,826,705 | 5/1989 | Drain et al. | 427/54.1 |
| 4,830,922 | 5/1989 | Sparrowhawk et al. | 428/411.1 |
| 4,880,663 | 11/1989 | Shimada | 427/96 |
| 4,956,221 | 9/1990 | Guteck | 427/515 |
| 5,063,254 | 11/1991 | Nakos | 427/515 |

OTHER PUBLICATIONS

Anonymous, "Surface Mount Integrated Circuit Conformal Coating Process," (Disclosure 30686), *Research Disclosure*, pp. 753–754 (Oct. 1989).

Nordson Select Coat System (Brochure No. 306-1-8-857), 1989 (no month date).

CL7000 Selective Conformal Coating & Drying, integrated technologies, Inc. (no date).

S5000 Selective Coating, integrated technologies, Inc. (no date).

*Primary Examiner*—Shrive Beck
*Assistant Examiner*—Katherine A. Bareford
*Attorney, Agent, or Firm*—Cary W. Brooks; Mark A. Navarre

[57] ABSTRACT

Disclosed is an automatic vertical dip coater with simultaneous UV curing. The invention includes a method of automatically dip-coating and simultaneously UV curing a conformal coating on both sides of a circuit board including the steps of positioning a circuit board, to be coated on both sides with a conformal coating, on a tool; advancing said tool towards a dip-coating tank containing a UV curable conformal coating so that both sides of said circuit board are immersed in said conformal coating to a predetermined position; advancing said tool passed opposed UV lamps so that the conformal coating on both sides of said circuit board is simultaneously cured by ultraviolet light.

2 Claims, 4 Drawing Sheets

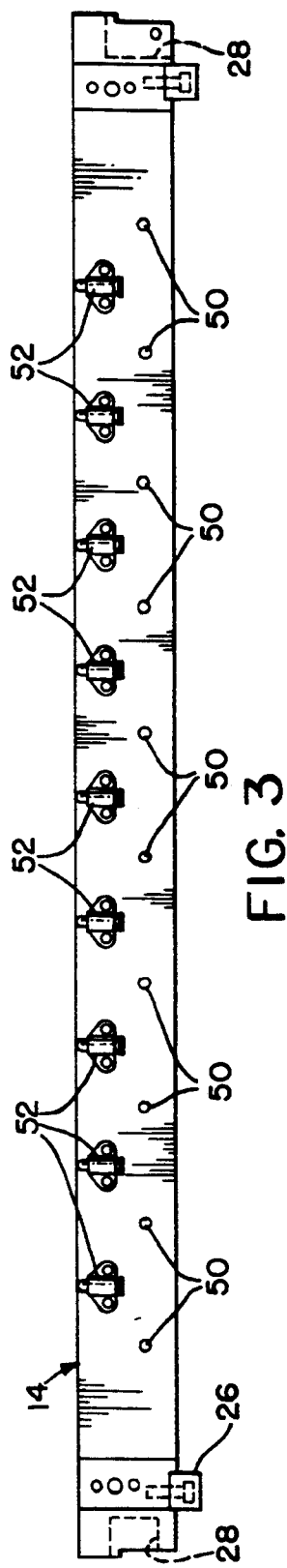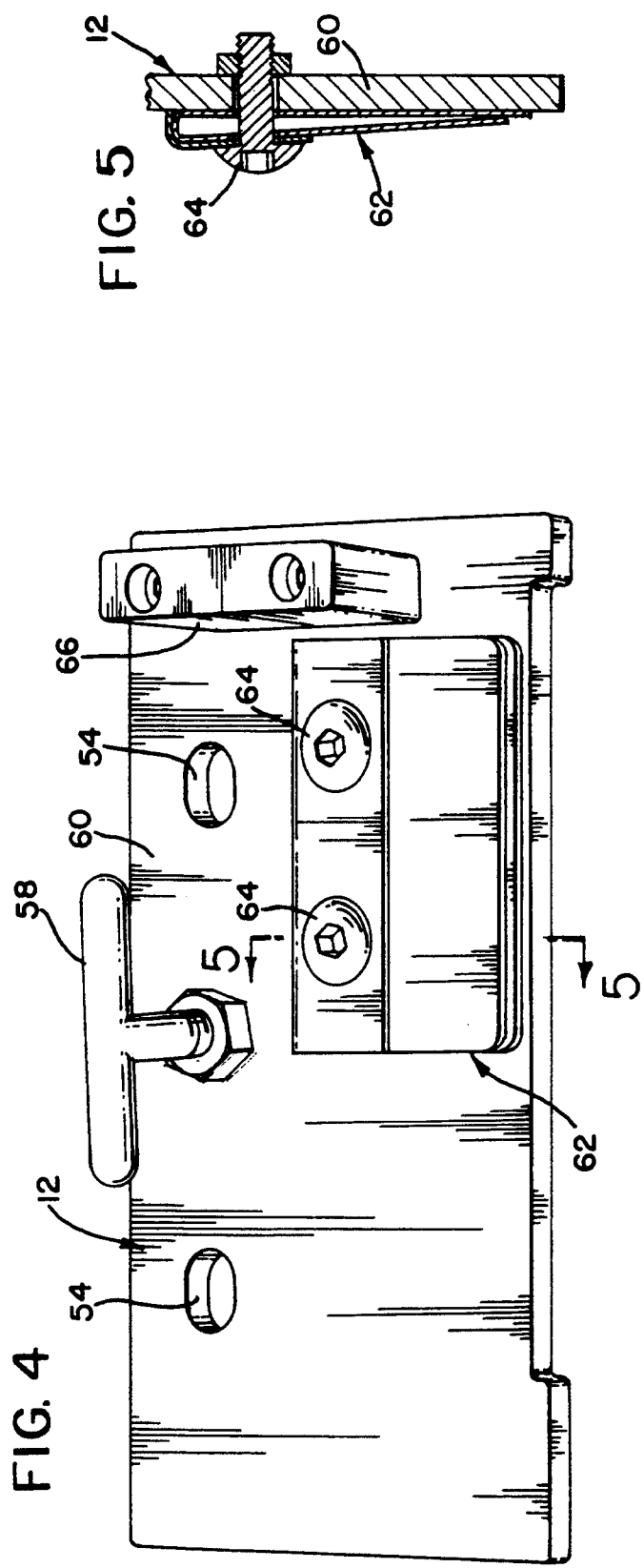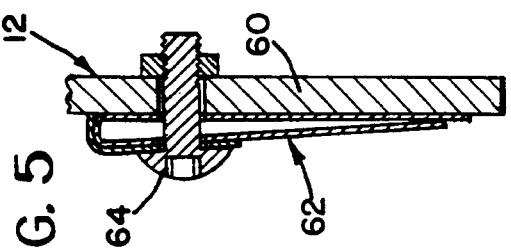

AUTOMATIC VERTICAL DIP COATER WITH SIMULTANEOUS ULTRAVIOLET CURE

This is a continuation-in-part of U.S. Ser. No. 07/843,385, filed Feb. 28, 1992, now abandoned, and the benefit of the prior filing date is hereby claimed.

FIELD OF THE INVENTION

This invention relates to a method (process) and/or apparatus for automatically conformal coating circuit boards by submerging a board in a coating and simultaneously curing both sides of the board with ultraviolet light.

This is the first production model of dip coater with ultraviolet (UV) curing. Heat curing is currently the most widely used method of cure for conformal coating. Most current ultraviolet curing is performed in a horizontal manner on a belt conveyor. The instant method of coating and curing reduced the cycle time by 93%.

Simultaneous UV curing was thought to be impossible. The machine of the instant invention contains UV lamps directly across from each other allowing the circuit boards to cure on both sides at the same time. A dip coater that allows 100% solids UV cure material to be contained in an open reservoir has not been possible in the past. The instant invention coats boards at a speed of 6 feet a minute as opposed to the 18 inches per minute used in the past. The present invention is the only machine in the world that can run production in a synchronous fashion with instantaneous product change over capabilities. A number of technologies had to be invented to make this system function including the pump and recirculation system, tooling technology, dip tank, nitrogen blanket, and ultrasonic level detection.

SUMMARY OF THE INVENTION

The present invention utilizes simultaneous UV cure which has never been accomplished before. The UV lamps are directly across from each other. Also, the UV oven contains variable wattage for each of the four lamps with possible settings of 100, 200 or 300 watts. It also contains a shuttering system to protect the circuit boards when the conveyor is shut off. The shuttering system also protects the UV lamps from exposure to the other UV lamps directly across from each other. Lamps directly across from each other would quickly burn out otherwise. These features allow unique curing characteristics for different processes and materials.

The present system contains a specially designed nitrogen blanket that protects the tank of material from moisture in the air. This type of nitrogen inerting has not been incorporated into this type of equipment previously.

The present invention is the first system that has the capability of unloading coated products from either the front or the rear of the equipment. The present invention includes a tool system including universal toolbars that remain on the equipment and individual pieces of tooling dedicated to each product, that interface with the toolbars. Therefore, when changing from one product to another, one simply has to remove the individual tooling on the fly. This has completely eliminated the need for shutting down the machine for product changeover, and has been a tremendous success.

The instant equipment requires a 3.5 minute cycle time with 20 seconds of that cycle devoted to the actual UV cure cycle. This is compared to the previous 45–50 minute cycle time we used to have with the previous heat cure equipment, with 40–45 minutes devoted to the cure cycle.

The instant system contains a unique method of locating, leveling and maintaining the position of the circuit board with respect to the liquid level. This includes the graphite guide bars, toolbar attachments and slots in the toolbar.

The system contains very efficient means of cooling both the UV lamps and the circuit boards. Overheating of the product is a very common problem with UV curing. This system runs much cooler than most UV systems with that many bulbs and high wattage.

The system includes a tank circulation systems, overflow dam, ultrasonic sensor interface, and a nitrogen blanket. The coating pump system includes a Teflon ® coated pump such as Model 100 from Trebor, Inc. A paper conveyor system is included in the system. Dip coating produces an abundance of drippings and discarded material. Prior art designs could not effectively accommodate this problem, so a paper conveyor systems was designed to catch this excess material and allow it to be easily discarded.

The instant automatic coating system allows an operator to load the circuit boards onto universal toolbars at the load station. The tooling is mounted between two chains and utilizes a conventional chain drive. The circuit boards will then travel through a tank of coating material maintained at a precise level, submerging the portion of the board that requires coating coverage. Next, the boards will be allowed to drip onto disposable paper or a drip pan prior to passing by the UV lamps. The boards will then travel through the oven where both sides will be cured simultaneously. The simultaneous curing of both sides of the circuit board prevents the dewetting problem associated with systems that cure only one side of the board at a time. After the prescribed amount of curing the boards will travel back to the unload station as they cool down, where they will be removed by the operator.

The system is designed so that the boards cannot hang directly above one another during any part of the cycle after being coated, except just prior to unloading. This includes the entire curing cycle.

The dip tank allows for a minimum of 2 inches of height adjustment in the vertical direction and contains a means of precise leveling. The overflow dam must be located in the back of the dip tank since the circuit boards will be traveling from front to back.

The recirculation system maintains a constant liquid level that varies no more than +/− 0.020 inches. This system includes a diaphram pump available under the trade name TREBOR ®.

The recirculation system must contain a filter system that is easy to access and change without shutting down the equipment. This filter system should be designed to remove tiny particles of cured coating material to protect the viscometer and pump. Preferably the filter consists of a prescribed wire mesh which fits inside a canister. The filter can be accessed and/or replaced while the machine is operating via a bypass system.

A nitrogen blanket must be maintained on the surface of the coating material at all times. This may require a reduced flow when the lid is in place.

An automatic material replenishment system that does not affect the recirculation system or the liquid level is included. This material replacement is plumbed into the recirculation pumping system.

The viscosity is automatically measured and displayed to aid in the determination of material degradation.

The dip tank includes a lid that may be utilized during prolonged downtime. Nitrogen will still be used with the lid, and sensors must be present to eliminate the possibility of indexing the conveyor with the lid in place.

A paper conveyor system is used to catch excess coating material when coating drips off of the circuit board so as to protect the equipment. The paper roll sits directly behind the dip tank in the front of the machine and feeds out the back of the machine.

The UV oven must be capable of curing both sides of the boards at the same time. The lamps are diffused, eliminating the need for rotation of the lamps. The UV lamp system includes an automatic shutter mechanism that is tied to the conveyor switch so that the circuit boards are not over-exposed when the conveyor is turned off. The system automatically turns the lamps to the lowest wattage setting when the shutters are closed to maximize lamp life and minimize heat build up. When the conveyor is started up again, the shutters open and the lamp wattage instantaneously increased to the automatic operating setting. For safety, the lamps are also tied to all access panels to prevent an operator from looking into the machine while the lamps are on.

The circuit boards are exposed to a maximum amount of UV energy without exceeding 85 degrees C. during normal operating conditions. The low temperature is due to special quartz plates 100 located in front of the UV lamps. These plates filter out the IR wavelength portion of the spectrum which isolates most of the heat generated by the lamps from the circuit board. Further, 3000 CFM of ventilation also assists in minimizing temperature build up.

The lamps may have a minimum of three adjustable wattage settings that are controlled by a switch on the main control panel. These settings should allow for a large increase in energy (for example 100, 200, 300 watts). The UV light and associated heat is completely isolated from the dip tank and the operator.

The system includes a self-contained chiller to cool the lamps. The following items may be monitored on a continuous basis with the displays located at the operator station:
Viscosity
Nitrogen Flow Rate
Humidity
Conveyor Speed and
Coating Level.

A suitable conformal coating is disclosed in U.S. Pat. No. 5,271,953 and U.S. Pat. No. 5,240,746, the disclosures of which are hereby incorporated by reference. Such a conformal coating may be a viscous, curable silicone liquid material, such as "100% Solids Silicone Conformal Coating, RTV Silicone product type, Formula No. X-125457" (Loctite Corp., Newington, Conn.), containing 95–100% polysiloxane, 0.1–1% photoinitiator: CAS No. 6175-45-7, 0.1–1% photoinitiator: CAS No. 7473-98-5, and 0.1–1% titanium derivative: CAS No. 546-68-9. The conformal coating includes a moisture curing agent to cure coating underneath the electronic component on the circuit board which are not exposed to the UV light. A suitable material is now available from Loctite Corp., under the trade name Shadowcure ® 5291.

A nitrogen blanket of 1600–1800 cubic feet/hour is needed on the dip tank to prevent moisture curing of the coating in the dip tank during operation. When the coating system is not in operation, a lid is placed on the dip tank and the nitrogen blanket can be reduced to 500–600 cubic feet/hour. The nitrogen blanket is produced using a porous diffuser tube 70 made of powdered stainless. As a result, the velocity of the nitrogen, even at large volume rates, is approximately 200 fpm. The diffuser can be placed just above the surface of the coating material at a distance of approximately ½ inch, and still not disturb the liquid.

BRIEF DESCRIPTION OF THE DRAWINGS

FIG. 3 illustrates a tool bar according to the present invention;

FIGS. 4 and 5 show one embodiment of a tool according to the present invention;

DETAILED DESCRIPTION

Figure 1:
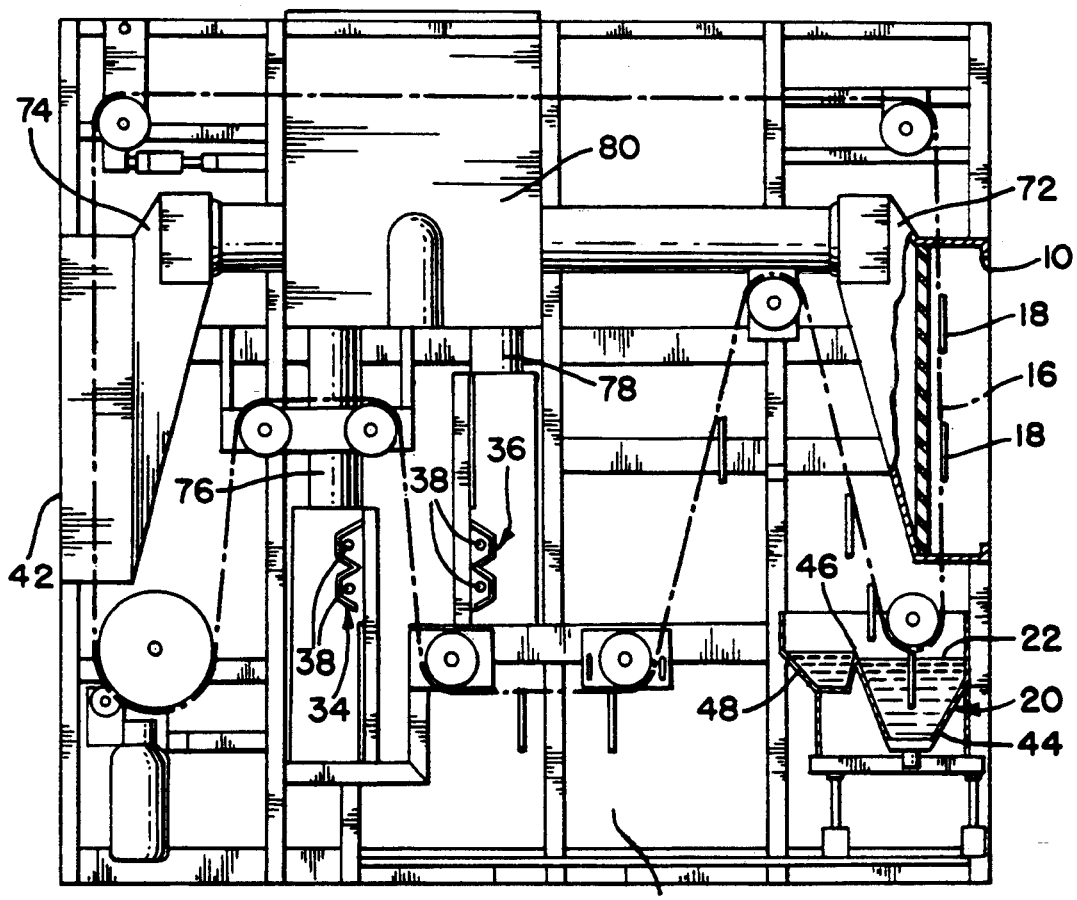
FIG. 1 is a schematic illustration of an automatic vertical dip coating machine with simultaneous ultraviolet cure according to the present invention.
Figure 2:
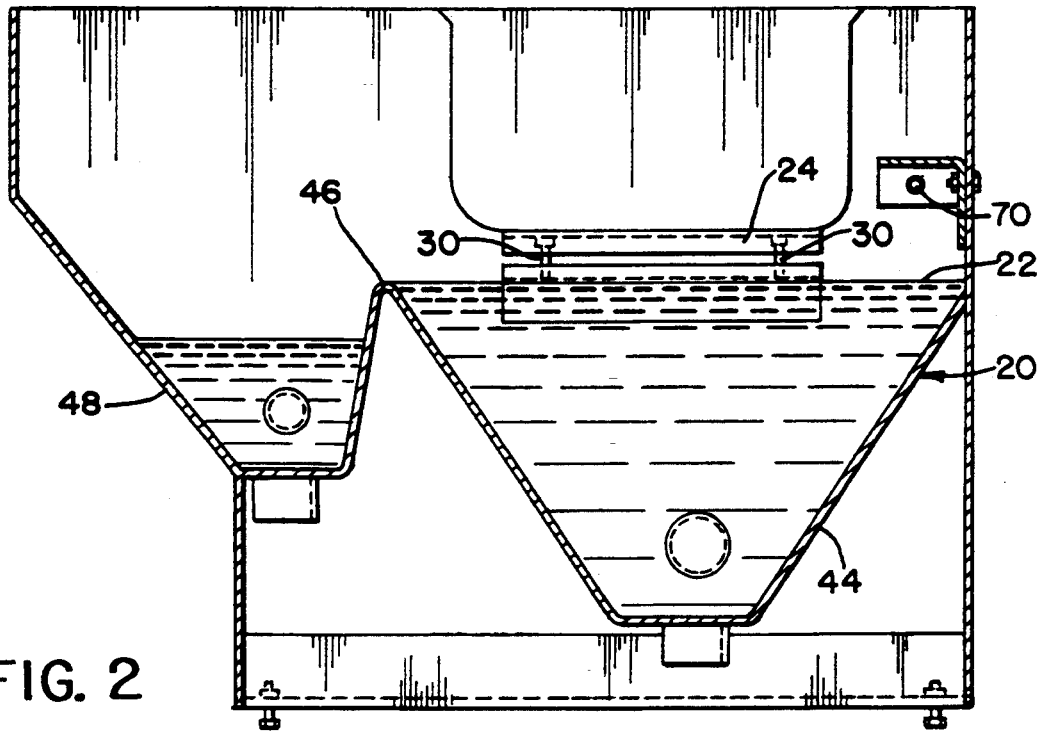
FIG. 2 is a schematic illustration of a dip tank according to the present invention.

FIGS. 1–3 illustrate illustration of an automatic vertical dip coating machine with simultaneous UV cure according to the present invention. The machine includes a loading window 10 which provides access to a circuit board tool 12 secured to a toolbar 14 which is rotating on the conveyor chain 16 as described above as shown in FIGS. 3–5. Several toolbars and circuit board tools are secured on the chain conveyor. The circuit board 18 to be coated with a conformal coating is positioned on the tool by an operator as it moves past the loading window. The tool is then moved towards the dip tank 20 where the board is immersed in the conformal coating 22 to a predetermined depth. To assure that specific portions circuit boards are accurately coated on a day-to-day operation, the system includes a graphite guide bar 24 fixed to the dip tank. The tool bar rides across the graphite guide bar, preferably on toolbar blocks 26, to assure that the circuit board is dipped to a specific depth during day-to-day operation. To accomplish this, the toolbar is formed with slots 28 in each end where the toolbar interfaces with a pin (not shown) on the chain. This provides for about one inch of vertical play in the movement of the toolbar on the chain. When the system is not in operation, the tank must be lowered below the chain sprocket so that a lid can be placed on the tank to keep the coating from setting up. To resume operation, the tank must be raised again so that the circuit board can be dipped in the coating. The graphite guide bar can be selectively adjusted vertically so that when the toolbar rides across the guide, the circuit board is accurately dipped to a predetermined level.

The guide bar is slidably secured to two shoulder pins 30 so that the guide bar can be vertically adjusted.

The circuit board then is moved by the chain conveyor through a drip well area 32 where excess conformal coating is allowed to drip off the circuit board. The conveyor chain is constructed and arranged so as to move either horizontally or at an angle such that conformal coating is not dripped from circuit boards secured to one toolbar onto circuit boards on another toolbar. The circuit board is advanced from the drip well area to opposed UV light sources 34, 36 so that both sides of the circuit board may be simultaneously cured by ultraviolet light at the same time. Preferably, the UV light sources include ultraviolet light lamps 38 as described above and shutters 40 to prevent excess heating of the circuit boards and damage to the electrical components contained thereon. The shutters are also constructed and arranged to prevent the oppositely positioned UV lamps from subjecting each other to unnecessary exposure. If the UV lamps were positioned directly across from each other without shutters, the UV lamps would quickly burn out. The circuit boards are then advanced from the UV light source to an unloading window 42 where they are easily removed from the toolbar tool.

As illustrated in FIG. 2, the dip tank 20 according to the present invention includes a primary reservoir 44 which maintains the conformal coating to a level such that when the circuit board is submerged in the coating, a specific portion of the circuit board is reliably covered with coating material. The dip tank includes a dam 46 and an overflow reservoir 48 to maintain a constant level in the main dip tank reservoir. The system also includes an ultrasonic level sensor (not shown) which communicates with a source for supplying additional conformal coating material to the dip tank should the level of conformal coating drop below a predetermined position in the back, overflow portion of the dip tank.

As illustrated in FIG. 3 toolbar 14 according to the present invention includes a plurality of pins 50 and spring loaded clamps 52 for releasably holding a circuit board tool 12. The circuit board tool 12 has holes 54 for receiving pins 50 in the toolbar 14. A beveled spring loaded clamp 52 is positioned to push downward on the top edge 56 of the circuit board tool 12 and firmly secured in position by the toolbar pins. The spring loaded clamps 52 also function to insure that the tool is properly positioned on the toolbar. Preferably, the tool includes a T-shaped handle 58 so that the tool may be easily removed from the toolbar by pulling on the handle. The system also includes a loading window ventilation hood 72, an unloading window ventilation hood 74, and lamp ventilation hoods 76,78, all connected to a central ventilation stack 80.

FIGS. 4 and 5 show one embodiment of a tool 12 according to the present invention. Such a tool includes a flat plate 60, a handle 58, holes 54 that communicate with the pins 50 of the toolbar, and a U-shaped resilient clip 62. As shown in FIG. 5, the U-shaped clip is designed such that a circuit board may be inserted into the clip to a predetermined position and held there during the dipping and curing operation. The U-shaped clip may be secured to the tool by a screw 64. The tool may include a stop 66 to align the circuit board.

Figure 6:
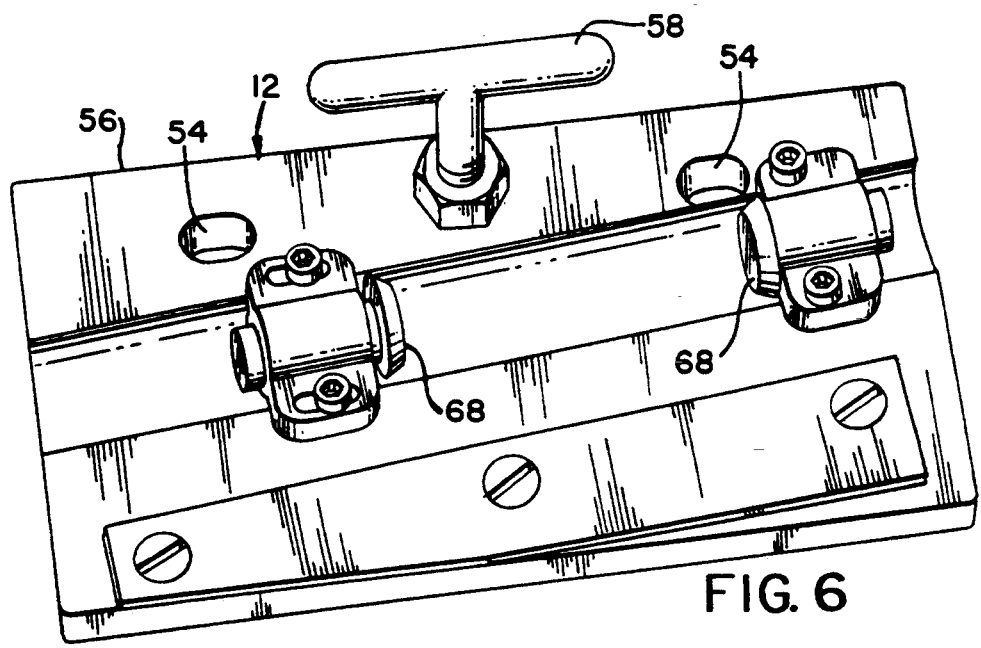
FIG. 6 shows an alternative embodiment of a tool according to the present invention.

FIG. 6 shows an alternative embodiment of a tool according to the present invention. The tool includes a flat plate, holes 54 that communicates with the pins 50 of the toolbar. The tool includes opposed beveled shaped clips 68 which are spring loaded so that a portion of the circuit board may be pushed past the bevel of the clip and held in position during the dipping and curing operation. The tools (FIGS. 4–6) are constructed and arranged so that the circuit board may be easily removed at the unloading window.

Figure 7:
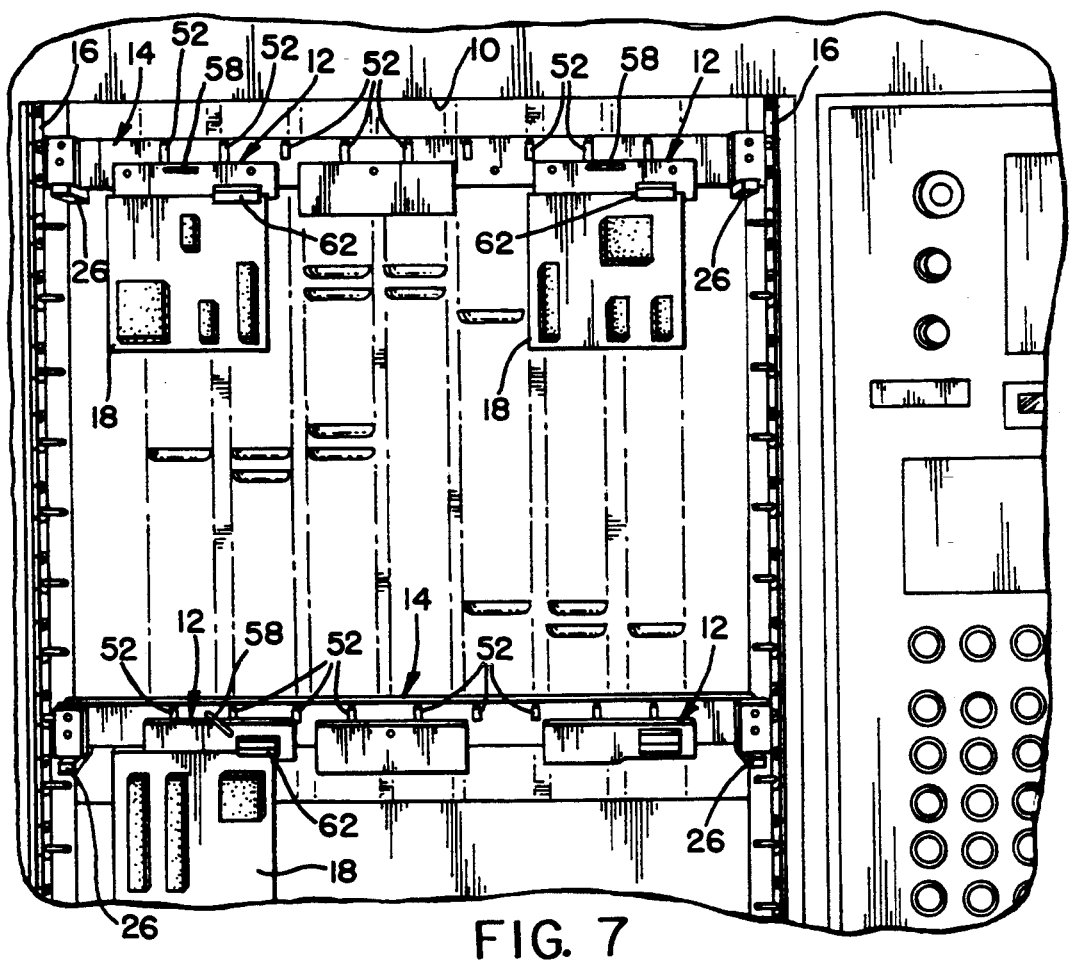
FIG. 7 illustrates a tool bar including a tool attached to a chain conveyor according to the present invention.

FIG. 7 illustrates a toolbar including a tool according to the present invention attached to a chain conveyor.

Figure 8:
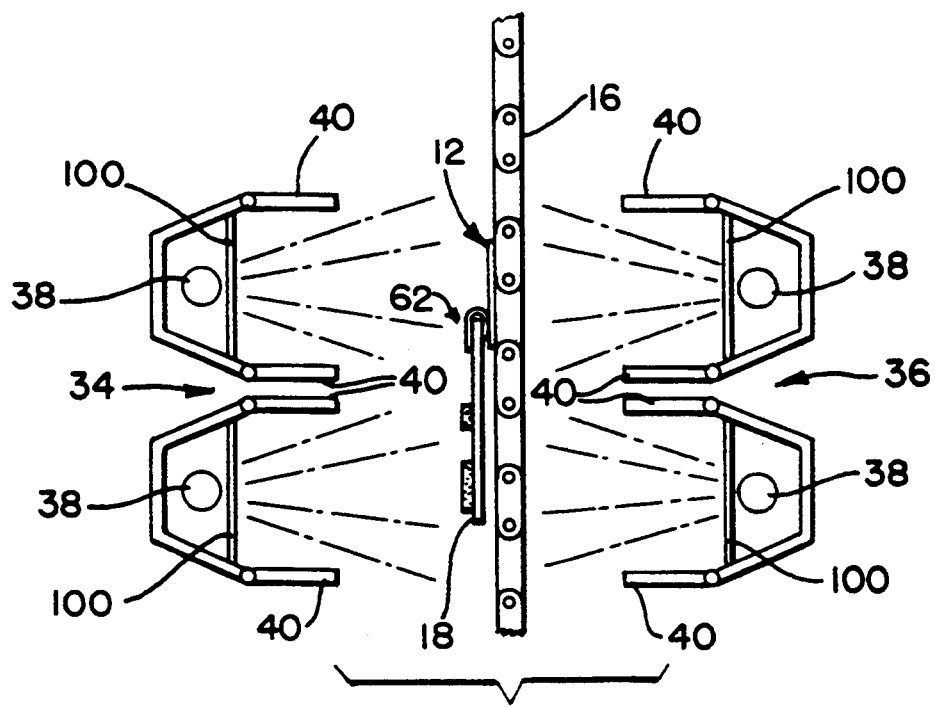
FIG. 8 is an illustration of a circuit board secured to a tool and a tool bar on a chain conveyor and positioned between opposed sets of ultraviolet light lamps with shutters in an open position.

FIG. 8 is an illustration of a circuit board secured to a tool and toolbar on a chain conveyor and positioned between two opposed sets of UV lamps with the shutters open. As shown, light from the lamps 38 passes through the elements 100 and impinges on the circuit boards 18 when the shutters 40 are open.

Figure 9:
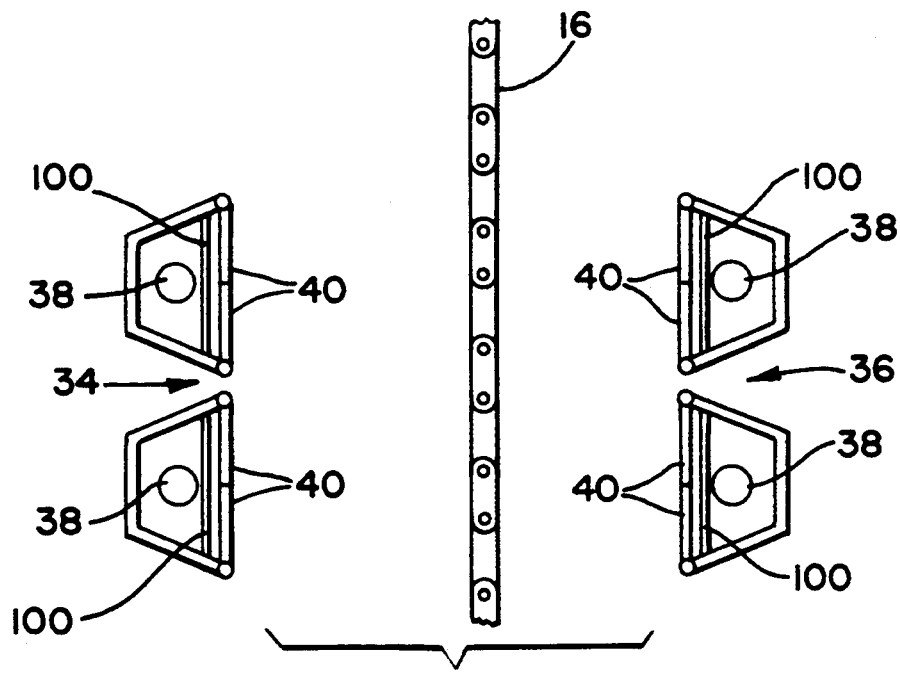
FIG. 9 illustrates two opposed sets of ultraviolet light lamps with shutters in a closed position.

FIG. 9 illustrates two opposed sets of UV lamps with the shutters closed.

The embodiments of the invention in which an exclusive property or privilege is claimed are defined as follows:

1. A method of automatically dip coating and then simultaneously ultraviolet curing a conformal coating on both sides of a circuit board comprising:
    positioning a circuit board, to be coated on both sides with a conformal coating, on a tool;
    advancing said tool toward a dip tank containing a ultraviolet curable conformal coating so that both sides of said circuit board are at least partially immersed in said conformal coating;
    advancing said tool past oppositely positioned ultraviolet lamps so that the conformal coating on both sides of said circuit board is simultaneously cured by ultraviolet light; and
    providing a nitrogen blanket on said conformal coating in said dip tank at a rate of about 1600 to about 1800 cubic feet/hour to prevent said conformal coating from curing in said dip tank.

2. A method of automatically dip coating and then simultaneously ultraviolet curing a conformal coating on both sides of a circuit board comprising:
    positioning a circuit board, to be coated on both sides with a conformal coating, on a tool said tool carried by a tool bar;
    advancing said tool toward a dip tank containing a ultraviolet curable conformal coating so that both sides of said circuit board are at least partially immersed in said conformal coating;
    advancing said tool past oppositely positioned ultraviolet lamps so that the conformal coating on both sides of said circuit board is simultaneously cured by ultraviolet light; and
    adjusting the vertical position of a guide bar slidably secured on two shoulder pins attached to the dip tank so that said tool bar rides across said guide bar as the tool is advanced so that both sides of said circuit board are at least partially immersed in said conformal coating.

* * * * *